United States Patent
Morgana (10) Patent No.: US 11,307,222 B2
(45) Date of Patent: Apr. 19, 2022

(54) CONTACT PROBE FOR A TESTING HEAD FOR TESTING ELECTRONIC DEVICES

(71) Applicant: Technoprobe S.p.A., Cernusco Lombardone (IT)

(72) Inventor: Fabio Morgana, Cernusco Lombardone (IT)

(73) Assignee: Technoprobe S.p.A., Cernusco Lombardone (IT)

(*) Notice: Subject to any disclaimer, the term of this patent is extended or adjusted under 35 U.S.C. 154(b) by 0 days.

(21) Appl. No.: 16/903,948

(22) Filed: Jun. 17, 2020

(65) Prior Publication Data

US 2020/0379009 A1 Dec. 3, 2020

Related U.S. Application Data

(63) Continuation-in-part of application No. PCT/EP2018/083302, filed on Dec. 3, 2018.

(51) Int. Cl.
*G01R 1/067* (2006.01)
*G01R 1/073* (2006.01)
*G01R 31/26* (2020.01)

(52) U.S. Cl.
CPC ..... *G01R 1/06744* (2013.01); *G01R 1/06738* (2013.01); *G01R 1/06755* (2013.01); *G01R 1/073* (2013.01); *G01R 31/26* (2013.01)

(58) Field of Classification Search
CPC ...... G01R 1/06; G01R 1/067; G01R 1/06705; G01R 1/06711; G01R 1/06716;
(Continued)

(56) References Cited

U.S. PATENT DOCUMENTS

| 5,532,613 A | 7/1996 | Nagasawa et al. |
| 2008/0074128 A1* | 3/2008 | Hirakawa .......... G01R 1/06755 324/755.01 |

(Continued)

FOREIGN PATENT DOCUMENTS

| JP | 2003-177143 A | 6/2003 |
| JP | 2003177143 A * | 6/2003 |
| WO | 2016/146451 | 9/2016 |

OTHER PUBLICATIONS

English machine translation of Okubo JP 2003177143 (Year: 2003).*

*Primary Examiner* — Lee E Rodak
(74) *Attorney, Agent, or Firm* — Seed Intellectual Property Law Group LLP (57) ABSTRACT

A contact probe for a testing head for testing electronic devices includes a rod-like body made of a first conductive material and extending along a longitudinal axis, and a contact tip supported by the body at an end portion thereof. The contact tip is made of a second conductive material that is different from the first conductive material. The contact tip includes a contact zone configured to perform mechanical and electrical contact with contact pads of a device under test. The body and the contact tip include respective contact surfaces in contact with each other. The contact surfaces are complementary to each other and include respective connection elements engaging each other. The connection elements include a protruding element projecting from the contact surface of one among the body and the contact tip, and a recess made in the other among the body and the contact tip.

15 Claims, 5 Drawing Sheets

(58) Field of Classification Search
CPC ............ G01R 1/06722; G01R 1/06727; G01R 1/06733; G01R 1/06738; G01R 1/06744; G01R 1/06755; G01R 1/073; G01R 1/07307; G01R 1/07314; G01R 1/07392; G01R 31/26; G01R 1/07357; G01R 1/0416

See application file for complete search history.

(56) References Cited

U.S. PATENT DOCUMENTS

| | | | |
|---|---|---|---|
| 2008/0186038 A1 | 8/2008 | Hirakawa et al. | |
| 2009/0009197 A1* | 1/2009 | Hirakawa | G01R 1/06733 324/755.01 |
| 2012/0068726 A1* | 3/2012 | Hayashizaki | G01R 1/06738 324/755.01 |
| 2013/0321016 A1* | 12/2013 | Hirakawa | G01R 1/06794 324/755.01 |

\* cited by examiner

CONTACT PROBE FOR A TESTING HEAD FOR TESTING ELECTRONIC DEVICES

BACKGROUND

Technical Field

The present disclosure relates to a contact probe for a testing head for a test equipment of electronic devices integrated on a semiconductor wafer, and the following description is made with reference to this application field with the only purpose of simplifying the exposition thereof.

DESCRIPTION OF THE RELATED ART

As it is well known, a testing head is a device adapted to electrically connect a plurality of contact pads of a microstructure, particularly an electronic device integrated on a wafer, with corresponding channels of a testing machine which performs the functionality testing thereof, particularly the electrical one, or generically the test.

The test, which is performed on integrated devices, is particularly useful in detecting and isolating defective circuits as early as in the production phase. Normally, probe heads are therefore used for the electric tests of devices integrated on wafers before cutting and assembling them inside a chip containment package.

Generally, a probe head comprises a high number of contact elements or contact probes formed by special alloys with good electrical and mechanical properties and provided with at least one contact portion for a corresponding plurality of contact pads of a device under test.

A so-called "vertical probe head" comprises a plurality of contact probes retained by at least one pair of plates or guides that are substantially plate-shaped and parallel to each other. These guides are provided with suitable holes and are arranged at a certain distance from each other in order to leave a free space or air gap for the movement and possible deformation of the contact probes. In particular, the pair of guides comprises an upper guide and a lower guide, both provided with respective guide holes within which the contact probes axially slide, usually made of wires of special alloys with good electric and mechanical properties.

The good connection between the contact probes and the contact pads of the device under test is ensured by pressing the probe head on the device itself, the contact probes, which are movable within the guide holes made in the upper and lower guides, undergoing, during said pressing contact, a bending inside the air gap between the two guides and a sliding inside such guide holes.

Figure 1:
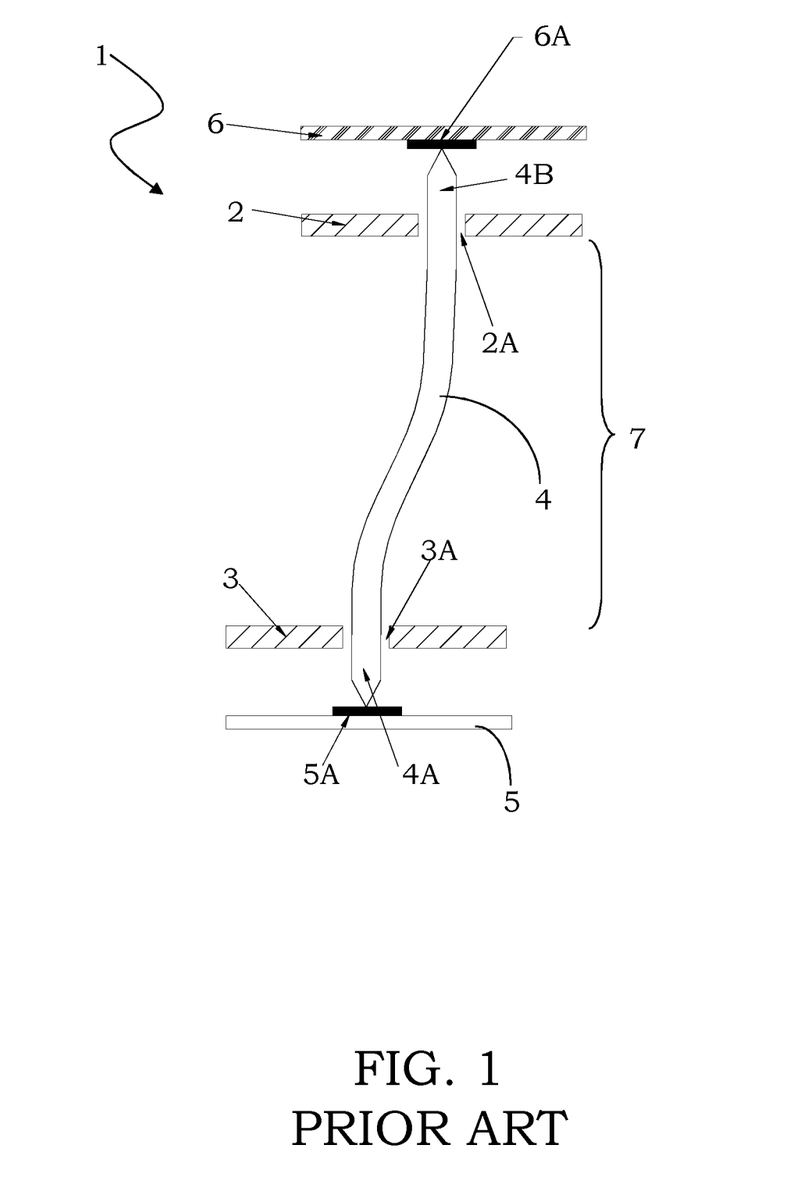
FIG. 1 schematically shows a contact probe, housed in a testing head, according to the prior art.

Furthermore, the bending of the contact probes in the air gap can be helped through an appropriate configuration of the probes themselves or their guides, as schematically illustrated in FIG. 1, where, for the sake of simplicity of illustration, a single contact probe of the plurality of contact probes usually comprised in a probe head has been shown, the probe head illustrated being of the so-called shifted-plate type.

In particular, FIG. 1 schematically shows a probe head 1 comprising at least one upper plate or guide 2 and a lower plate or guide 3, having respective upper guide holes 2a and lower guide holes 3a within which at least one contact probe 4 slides.

The contact probe 4 has at least one contact end or tip 4a, the terms end or tip indicating here and below an end portion, being not necessarily pointed. In particular, the contact tip 4a abuts onto a contact pad 5a of a device under test 5, performing the mechanical and electrical contact between that device and a testing equipment (not represented) which said probe head forms an end element of.

In some cases, the contact probes are fixedly fastened to the head itself at the upper guide: such probe heads are referred to as "blocked probe heads". Alternatively, probe heads are used with unblocked probes, i.e., probes not fixedly fastened, but held interfaced to a board through a micro-contact board: such probe heads are referred to as "unblocked probe heads". The micro-contact board is usually called "space transformer" since, besides contacting the probes, it also allows spatially redistributing the contact pads formed thereon with respect to the contact pads present on the device under test, in particular relaxing the distance constraints between the centers of the pads themselves.

In this case, as illustrated in FIG. 1, the contact probe 4 has a further contact tip 4b, in practice indicated as contact head, towards a plurality of contact pads 6a of the space transformer 6. The good electric contact between probes and space transformer is ensured analogously to the contact with the device under test by pressing the contact heads 4b of the contact probes 4 onto the contact pads 6a of the space transformer 6.

The upper guide 2 and the lower guide 3 are suitably spaced by an air gap 7 that allows the deformation of the contact probes 4 and ensures the contact of tip and contact head of the contact probes 4 with the contact pads of the device under test 5 and of the space transformer 6, respectively.

The correct working of a probe head is known to be basically linked to two parameters: the vertical movement, or overtravel, of the contact probes and the horizontal movement, or scrub, of the contact tips of such contact probes. Therefore, these features should be evaluated and calibrated in the manufacturing step of a probe head, since the good electric connection between probes and the device under test should always be ensured.

It is further known that the increase in the probe packing density desired by the most modern on-wafer integration technologies causes contact problems between adjacent probes, particularly during the deformation thereof in the operation of the testing head.

In order to ensure a correct orientation of the probes, and in particular of the deformed sections thereof (and thus also of the deformation thereof), it is known to manufacture contact probes with a non-circular, particularly rectangular cross section, as well as testing heads with guides having respective guide holes having in turn a non-circular, particularly rectangular, cross section, which hold the contact probes in the proper position during the contact thereof with the contact pads of the device under test (and therefore during the subsequent further deformation thereof).

In order to ensure a correct sliding of the probe inside a respective guide hole, as well as a correct holding in position of the probes inside the guides, while minimizing the risk of the probes getting stuck and thus the need to replace the head, it is known to coat the end portions of the contact probes 4 with layers of a conductive material having a higher hardness than that of the conductive material of the rest of the contact probe.

In particular, the coating layers extend at a terminal section of the respective end portion, from a tip up to the whole height of the respective guide hole.

However, high-hardness conductive materials have also a marked brittleness and can be manufactured only as films of reduced thickness, comprised for example between 0.01 μm and 5 μm.

Those high-hardness conductive materials can also be used to manufacture thin foils projecting from the body of the contact probes at the end portions thereof. Those foils, which are able to penetrate a possible oxide layer covering the contact pads, allow performing the contact also with the so-called bumps, i.e., conductive elements projecting from a device under test as contact portions, as it occurs in other embodiments for the contact pads. Those foils are however extremely brittle and subject to breaking, in particular when shear forces are present.

Therefore, it is desirable to provide a contact probe having structural and functional features so as to allow overcoming the limitations and drawbacks which still affect the known solutions, in particular able to improve the contact of the end portions thereof with respective contact pads of a device under test, while avoiding breaking phenomena of the end portions themselves.

BRIEF SUMMARY

The present disclosure provides a contact probe whose contact tip is entirely made of a conductive material being different from the conductive material of the probe body that supports such tip, in particular having a higher hardness, wherein the contact surfaces of the probe body and of the contact tip are so shaped that they are conjugated and complementary to each other, obtaining an interlocking connection.

More in particular, an exemplary contact probe for a testing head for testing electronic devices comprises a rod-like body, which is made of a first conductive material and extends along a longitudinal axis, and a contact tip supported by the body at an end portion thereof, the contact tip being made of a second conductive material that is different from the first conductive material of the body, the contact tip comprising a contact zone adapted to perform the mechanical and electrical contact with contact pads of a device under test, wherein the body and the contact tip comprise respective contact surfaces being in contact with each other, those contact surfaces being complementary to each other and shaped so as to comprise respective connection elements engaging each other, and wherein those connection elements are in the form of at least one protruding element projecting from the contact surface of one among the body and the contact tip, and in the form of at least one respective recess made in the other among that body and that contact tip, this protruding element and this recess fitting each other, i.e., perfectly mating each other. In other words, the connection elements are fully interlocking.

More particularly, the disclosure comprises the following additional characteristics, taken individually or in combination if required.

According to an aspect of the present disclosure, a maximum cross-section of the contact tip can be equal to a maximum cross-section of the body.

According to an aspect of the present disclosure, the protruding element and the recess can have at least one arc-shaped portion.

According to an aspect of the present disclosure, the contact tip can comprise at least one blunted portion.

According to another aspect of the present disclosure, at least one cross-sectional dimension of a portion of the contact tip can be smaller than a corresponding cross-sectional dimension of the body, this dimension being measured along a cross-sectional dimension being orthogonal to the longitudinal axis of the probe.

According to another aspect of the present disclosure, the contact tip can comprise a thinned portion, which extends along the longitudinal axis and has a substantially constant cross-section corresponding to the extension of the contact zone.

In particular, the thinned portion can have a length measured along the longitudinal axis comprised between 30 μm and 600 μm.

Furthermore, the thinned portion can be centered with respect to the symmetry axis of the body.

According to another aspect of the present disclosure, the first conductive material of the body can be copper, and the second conductive material of the contact tip can be selected from rhodium, palladium, iridium, platinum, or alloys thereof.

According to another aspect of the present disclosure, the protruding element can have a length, measured along the longitudinal axis, comprised between 10 μm and 100 μm.

According to another aspect of the present disclosure, the contact zone can be comprised only in the contact tip.

According to yet another aspect of the present disclosure, the contact tip can be tapered.

Finally, the transversal, cross-sectional, dimensions of the body and of the contact tip can be coincident.

The present disclosure also relates to a testing head for testing electronic devices, the testing head comprising at least one guide provided with a plurality of guide holes adapted to house a respective plurality of contact probes, this testing head being characterized in that at least one of those contact probes is made as described above.

The features and advantages of the contact probe and of the testing head according to the disclosure will become apparent from the following description of an embodiment thereof, given by way of non-limiting example with reference to the accompanying drawings.

DETAILED DESCRIPTION

With reference to those figures, a contact probe for a testing head for a test equipment of electronic devices integrated on a semiconductor wafer is globally and schematically indicated with the reference number 10.

It is worth noting that the figures represent schematic views and are not drawn to scale, but instead they are drawn so as to emphasize the important features of the disclosure. Moreover, in the figures, the different elements are depicted in a schematic manner, their shape varying depending on the application desired. It is also noted that in the figures the same reference numbers refer to elements that are identical in shape or function. Finally, particular features described in relation to an embodiment illustrated in a figure are also applicable to the other embodiments illustrated in the other figures.

As it will be explained in greater detail below, the contact probe 10 of the present disclosure ensures an improved mechanical and electrical contact with contact pads of a device under test.

The contact probe 10 comprises in particular a rod-like body 10' which extends along a longitudinal axis H-H and is made of a first conductive material, such as for example copper (Cu), although other conductive materials can obviously be used.

The body 10' extends between two end portions and supports, at one of those end portions (indicated herein with the reference number 10a), a contact tip 11 associated thereto. In other words, the end portion 10a of the body 10' is a support portion of the contact tip 11.

The contact tip 11 is adapted to contact the contact pads of the device under test (not shown in the figures). More particularly, the contact tip 11 comprises a contact zone 11c adapted to perform the mechanical and electrical contact with the contact pads of the device under test.

Suitably, the contact tip 11 is made of a second conductive material being different from the first conductive material of the body 10'. In particular, the conductive material of the contact tip 11 is a high-hardness conductive material, such as rhodium (Rh) for example. Obviously, other conductive materials can also be used to make the contact tip, such as for example palladium (Pd), iridium (Ir) and platinum (Pt), or alloys thereof.

In this way, the contact tip 11 of the contact probe 10 is a high-hardness element thereof supported at the end portion 10a of the body 10' and is adapted to perform, through the contact zone 11c, the mechanical and electrical contact with the pads of the device under test.

According to the present disclosure, the contact with the contact pads of the device under test is thus entirely and exclusively performed by the contact tip 11, the body 10' only acting as a mechanical support for that contact tip 11. In other words, the direct contact with the contact pads of the device under test only occurs through the second high-hardness conductive material which forms the contact tip 11.

The body 10' and the contact tip 11 comprise respective contact surfaces contacting each other and, advantageously according to the present disclosure, those contact surfaces are conjugated and complementary to each other and are so shaped as to comprise respective connection elements engaging each other.

The shape of the contact surfaces, and thus the geometry of the interface between the body 10' and the contact tip 11, contributes to improve the mechanical holding of the contact tip 11, with improved overall performances for the contact probe 10.

Due to the shape of the contact surfaces, the contact area or interface area between the body 10' and the contact tip 11 is thus considerably increased. In particular, the contact area is increased due to the presence of the connection elements engaging each other, those connection elements further allowing an interlocking connection between the body 10' and the contact tip 11 to be achieved.

Suitably, the contact area between the body 10' and the contact tip 11 is greater than the cross-sectional area of the body 10', specifically it is greater than the maximum cross-sectional area of the body 10' portion which supports the contact tip 11, as it will be illustrated in greater detail below.

Therefore, the interface between the body 10' and the contact tip 11 does not lie in a single cross-sectional plane but, according to the present disclosure, an advantageous multi-plane interface is made, wherein respective faces of the body 10' and of the contact tip 11 contacting each other are at least more than three.

The present disclosure provides in particular the presence of connection elements engaging each other so as to obtain a meshing effect between the body 10' and the contact tip 11.

According to solutions not part of the present disclosure, illustrated in the FIGS. 2A-2B and 3A-3B, the contact surfaces of the body 10' and of the contact tip 11 have a step-like shape. In other words, the connection elements which perform the holding of the contact tip 11 are steps of the contact surface of the body 10' and steps of the contact surface of the contact tip 11 engaging each other, the steps of the contact surface of the body 10' having a geometry which is complementary to that of the steps of the contact surface of the contact tip 11. The number and size of the steps can vary, for example as a function of the thickness of the contact tip 11 and/or of the used materials. The length of each step, measured along the longitudinal axis H-H, is sized so as to ensure on the one hand a high contact area between the body 10' and contact tip 11, and thus a good holding of that contact tip 11, as well as a high resistance of the steps of the contact surface of the contact tip 11, and on the other hand to avoid a notching effect which limits the resistance of the contact tip 11. By way of example, the steps can have a length of about 10 μm.

Figure 4:
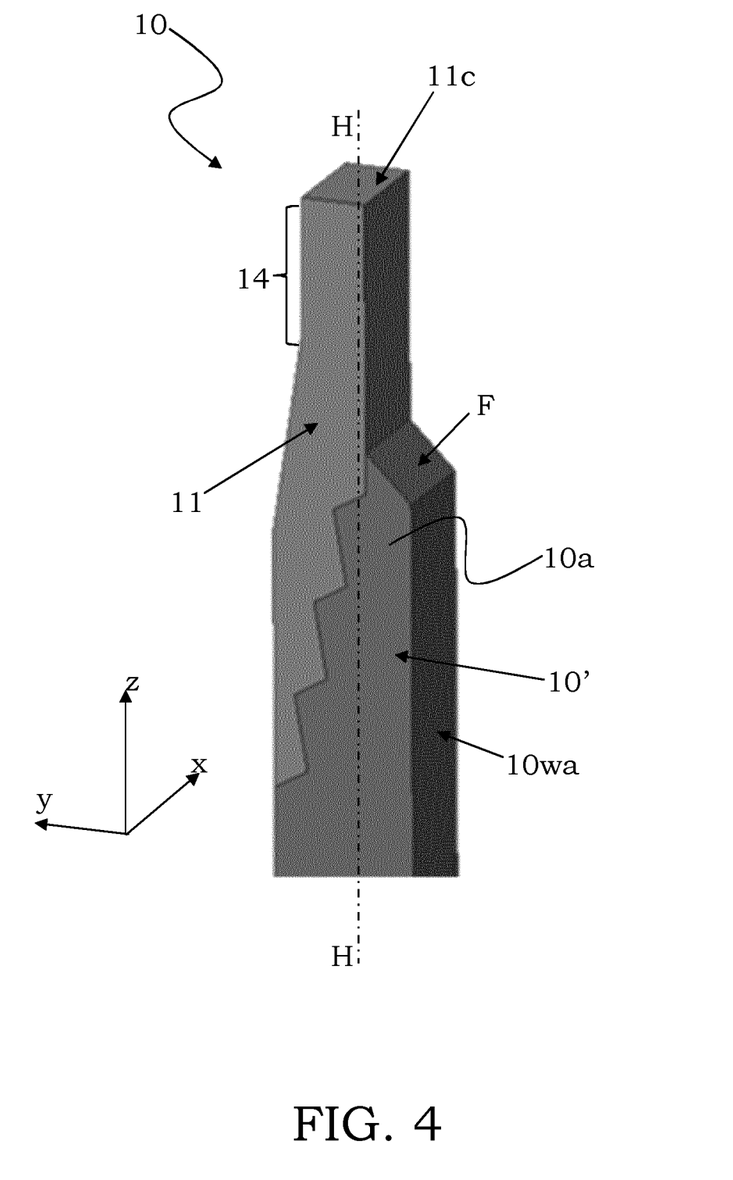
FIG. 4 schematically shows a perspective view of a contact probe.

The contact surfaces of the body 10' and of the contact tip 11 can also a triangular wave-like shape (as illustrated in FIG. 4), or a saw-tooth wave-like shape and the like, wherein, in any case, the contact surface of the body 10' is able to mate and interpenetrate with the contact surface of the contact tip 11 so as to achieve the desired interlocking connection and the holding of the contact tip 11.

Figures 2A, 2B:
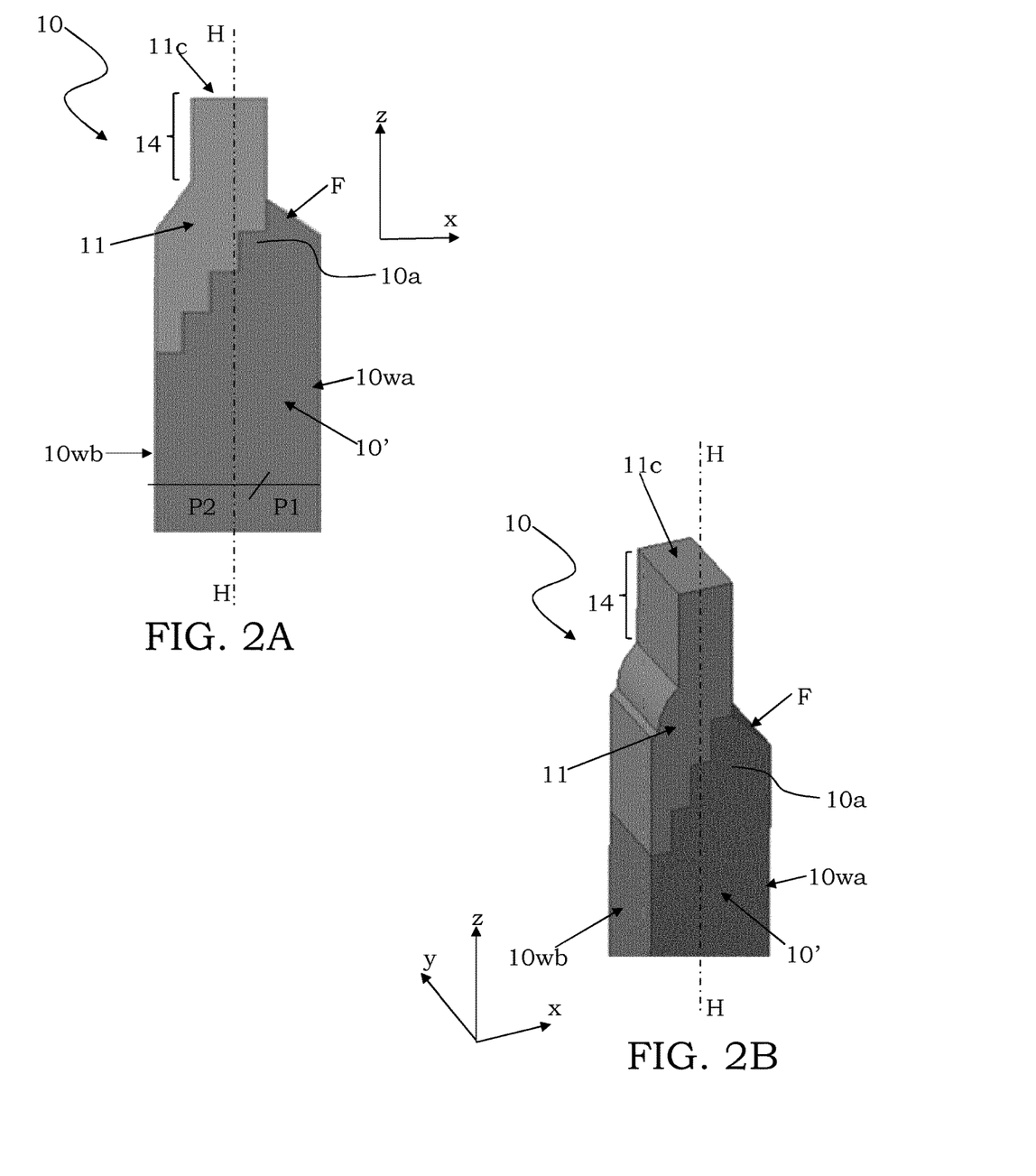
FIGS. 2A and 2B schematically show a front view and a perspective view of a contact probe, respectively.

Referring in particular to FIG. 2A, at least one cross-sectional dimension of the contact tip 11 can be smaller than the corresponding cross-sectional dimension of the body 10' and there is at least one face F of the body 10' at the end portion 10a thereof which does not support the contact tip 11. Preferably, only one cross-sectional dimension (measured along the x-axis according to the reference system of the figures) is smaller than the corresponding cross-sectional dimension of the body 10'. In this case, the contact tip 11 at the contact zone 11c has thus a cross-sectional area which is smaller than the maximum cross-sectional area of the body 10.

In this way, two portions of the body 10' can be defined: a first portion P1 underlying the face F and not underlying the contact tip 11, and a second portion P2 which supports the contact tip 11 and is underlying the latter. In other words, the first portion P1 is the portion of the body 10' having a cross-sectional area corresponding to the projection of the face F on a plane being orthogonal to the axis H-H, whereas the second portion P2 is the portion of the body 10' having a cross-sectional area corresponding to the projection of the contact surface with the contact tip 11 on a plane being orthogonal to the axis H-H.

The first portion P1 of the body 10' underlying the tilted face F is thus not intended to house the contact tip 11. The second portion P2 of the body 10' supports the contact tip 11 and, as indicated above, the contact surfaces are shaped so that the contact area between the body 10' and the contact tip 11 is greater than the maximum cross-sectional area of that second portion P2. Herein, the second portion P2 is also indicated as "support portion".

In the particular solutions of FIGS. 2A-2B, 3A-3B and 4, the body 10' of the contact probe 10 is tapered and comprises a blunted or cut portion. In particular, the blunting made in the body 10' is such that a wall 10wa of that body 10', which is opposed to a wall 10wb including the contact surface of the body 10', comprises the face F, which is tilted with respect to the longitudinal axis H-H, in particular tilted from the wall 10wa towards the inside of the body 10'.

The blunted portion of the body 10' can be made in various positions along the longitudinal axis H-H.

In the FIGS. 2A-2B, the tilted face F is made in the terminal portion of the body 10' and a side thereof is in direct contact with the contact tip 11.

Figure 3A:
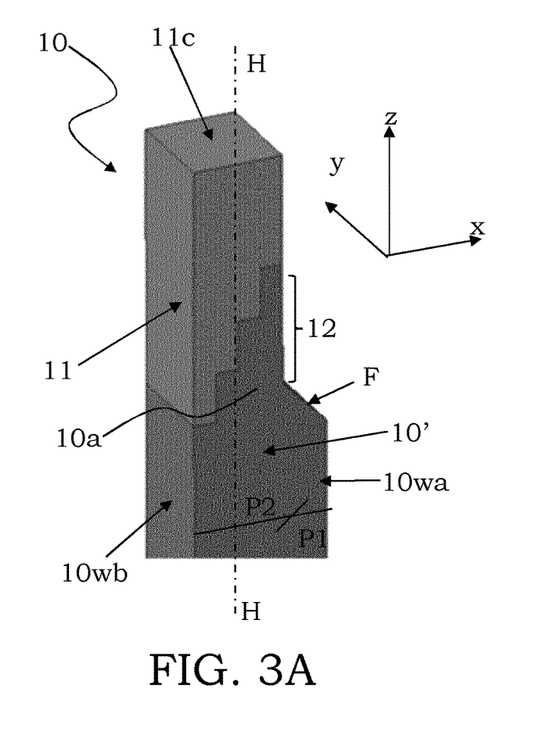
FIGS. 3A and 3B schematically show perspective views of a contact probe.
Figure 3B:
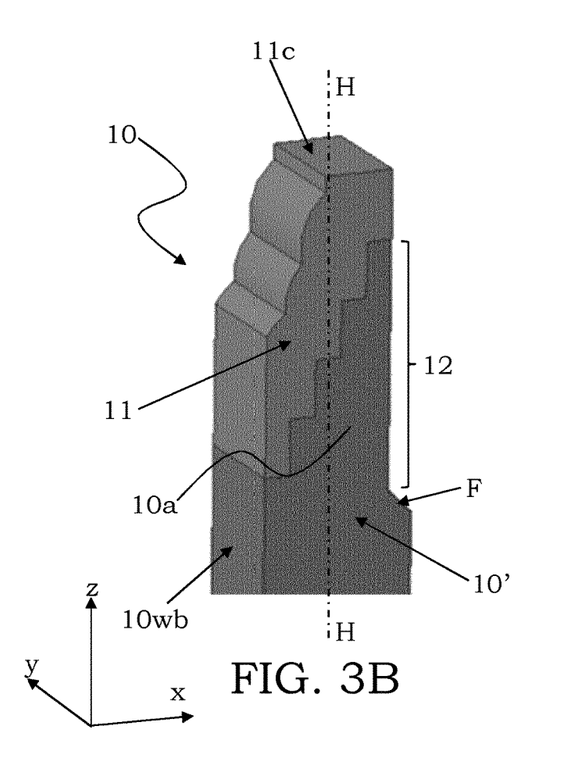

Alternatively, as illustrated in FIGS. 3A-3B, the blunted portion of the body 10' can be made in a position wherein the tilted face F is not in direct contact with the contact tip 11. In this case, the body 10' comprises a region 12 having a maximum cross-sectional area smaller than a maximum cross-sectional area of said body 10', that region 12 extending along the longitudinal axis H-H and forming the end portion 10a of the body 10'. In this case, the contact tip 11 is exclusively supported by the region 12 of the body 10' and the contact area between the body 10' and the contact tip 11 is greater than the maximum cross-sectional area of that region 12, as indicated above.

The maximum cross-sectional area of the contact tip 11 can vary from 500 µm2 to 2500 µm2 according to needs and/or circumstances.

The solutions shown in FIGS. 2A-2B, 3A-3B and 4, although being advantageous, still have some drawbacks, due to the fact that the particular geometry of the interface between the body and the contact tip does not always ensure an efficient interlocking between the body and the tip.

Figure 5A:
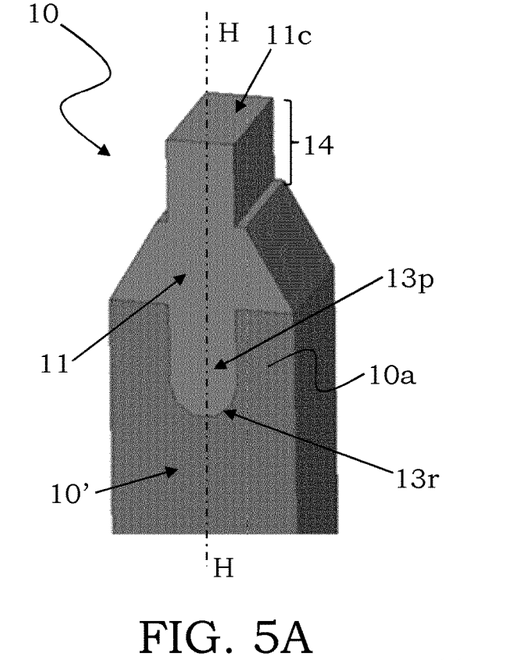
FIGS. 5A-5C schematically show perspective views of a contact probe according to the present disclosure.
Figure 5B:
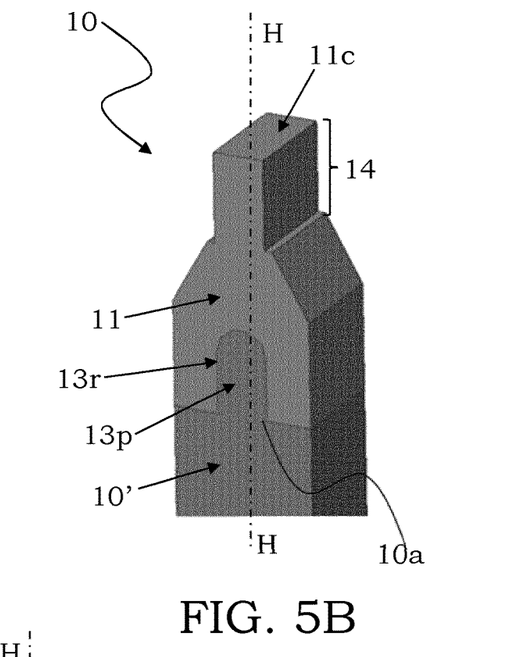
Figure 5C:
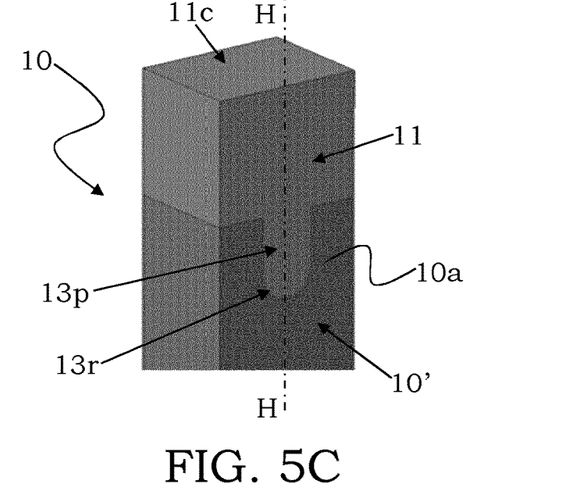

Advantageously according to the present disclosure, as shown in FIGS. 5A-5C, the body 10' of the contact probe 10 does not comprise a blunted portion and the maximum cross-sectional area of the contact tip 11 coincides with the maximum cross-sectional area of the body 10'. Therefore, according to present disclosure, the cross-sectional dimensions of the tip and of the body coincide.

In particular, the connection elements are in the form of a protruding element 13p, which protrudes from the contact surface of one among the body 10' and the contact tip 11, and of a respective recess 13r made in the other component, the protruding element 13p and the recess 13r having a conjugated and complementary shape and engaging each other.

The connection elements according to the present disclosure are fully interlocking, similarly to puzzle pieces.

In the embodiments of FIGS. 5A and 5C, the protruding element 13p is comprised in the contact tip 11 and protrudes from the contact surface thereof, whereas the recess 13r is comprised in the body 10'. Alternatively, in the embodiment of FIG. 5B, the protruding element 13p is comprised in the body 10' and projects from the contact surface thereof, whereas the recess 13r is comprised in the contact tip 11.

As an example, the protruding element 13p has a length, measured along the longitudinal axis H-H, comprised between 10 µm and 100 µm.

In a preferred embodiment of the present disclosure, the protruding element 13p and the recess 13r have at least one arc-shaped portion; in other words, they are at least partially curved, in particular at the terminal portion thereof along the longitudinal axis H-H.

The contact tip 11 comprises at least one blunted portion, so as to reduce the area of the contact zone 11c.

The reduction of the dimensions of the contact tip 11 allows the possibility of propagation of fractures and of both surface and internal defects of that contact tip 11 to be reduced, which generally occurs in high-hardness metals.

When the contact tip 11 comprises the blunted portion, according to embodiments of FIGS. 5A-5B, that contact tip 11 also comprises a thinned portion 14, which extends along the longitudinal axis H-H and has a substantially constant cross section having dimensions corresponding to the extension of the contact zone 11c, wherein such thinned portion 14 does not contact any portion of the body 10'. Thereby, the contact between the contact tip 11 and the contact pads of the device under test is made easier. The thinned portion can obviously be made also when the blunted portion is not present.

Suitably, the thinned portion 14 can be sized so as to make a so-called "wearable" tip, which can undergo several reshaping operations, increasing the working life of the corresponding contact probe and thus of the testing head which comprises such probes.

It is further preferable that, when the thinned portion 14 is present, it (and thus the contact zone 11c too) is centered with respect to the symmetry axis of the body 10; therefore, in a preferred embodiment, the thinned portion 14 is in a central position.

The length of the thinned portion 14, measured along the longitudinal axis H-H, can vary between 30 µm and 600 µm, preferably 200 µm, according to needs and/or circumstances. In general, the length of the interface between the body 10' and the contact tip 11, projected in a direction being parallel to the longitudinal axis H-H, is comparable to that of the thinned portion 14.

The body 10' and the contact tip 11 have at least one common cross-sectional dimension (generally the smaller cross-sectional dimension), which is measured along the y-axis according to the reference system of the figures and is variable between 25 µm and 60 µm, that dimension varying according to needs and/or circumstances, for example as a function of the electrical contact to be performed by the contact tip 11.

In any case, advantageously according to the present disclosure, the contact area between the tip and the body (i.e., the support of the tip) of the body 10' and the contact tip 11 is always greater than the maximum cross-sectional area of the body and the tip themselves. In other words, the contact area between the body 10' and the contact tip 11 is always greater than the area of the projection of the contact surface on a plane being orthogonal to the axis H-H.

Advantageously according to the present disclosure, the coupling between the protruding element 13p and the recess 13r ensures a better holding of the contact tip 11. In fact, the protruding element 13p acts a pin which holds the tip, wherein the projection of the contact surface coincides with the maximum cross-section area of the body.

The contact with the pads of the device under test is exclusively performed by the contact tip 11, which is properly held by the body 10' thanks to the particular geometry of the contact surfaces.

It is thus clear that the contact tip 11 according to the present disclosure is less subject to breakage and is adapted to resist to high shear and compression forces.

Furthermore, the thinned portion 14 can be easily made symmetric with respect to the longitudinal axis of the contact probe, simplifying the configuration of the testing head, as well as creating a real "consumption" tip.

As mentioned above, the contact probe 10 illustrated herein is adapted to be housed in a testing head for testing electronic devices, increasing the performances of the testing head itself. By way of example, the testing head can comprise at least one guide provided with a plurality of guide holes in which the contact probes of the present disclosure axially slide, although other solutions for this testing head can also be provided.

In conclusion, the present disclosure provides a contact probe wherein the contact tip is entirely made of a conductive material being different from the conductive material of the probe body that supports such tip, in particular having a higher hardness, wherein the contact surfaces of the probe body and of the contact tip are so shaped that they are conjugated and complementary to each other, obtaining an interlocking connection.

Advantageously according to the present disclosure, the shape of the interface between the probe body and the contact tip ensures a better holding of the contact tip and thus better performances of the contact probe as a whole. In this way, a contact probe can be provided with a contact tip made of a high-hardness material, solving the problems of holding this contact tip without resorting to the use of coating portions.

The present disclosure thus suitably enables a mechanical coupling between the probe body and the contact tip achieved through complementary geometries, wherein the contact surfaces comprise portions which mate and interpenetrate with each other, this coupling ensuring the desired mechanical holding of the contact probe.

The employed geometries, besides increasing the contact area and thus besides increasing the number of connections between the probe body and contact tip, ensure that forces are transmitted to the probe body in different directions, without any possibility of structural failure of the contact tip, making that tip more resistant to the various stresses undergone by the probe. It is in fact observed that the highest resistance is achieved in case of normal compression to the contact surfaces.

In particular, when the contact probe is manufactured by means of direct growth on the body (for example by galvanic deposition) it is possible to use growth parameters such that a tensile state in the contact tip and a corresponding compression of the interface is created, which ensures a better resistance to the following stresses.

Finally, the presence of a contact tip mad of a high-resistance conductive material, such as rhodium for example, allows the reliability of the electrical contact to be improved, the cleaning cycles to be decreased, possible tip activations after a quiescent period to be removed, as well as the tip consumption to be decreased in this way extending the working life thereof.

All the above-indicated advantages thus result in improved performances of the contact probe of the present disclosure.

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A contact probe for a testing head for testing electronic devices, comprising:

a rod-like body, which is made of a first conductive material and extends along a longitudinal axis, the body having an end portion including an end surface; and a contact tip supported by the body at the end portion thereof, the contact tip being made of a second conductive material that is different from the first conductive material of the body, the contact tip comprising a contact zone configured to perform mechanical and electrical contact with contact pads of a device under test, wherein the body and the contact tip comprise respective contact surfaces being in contact with each other, the contact surfaces being complementary to each other and shaped so as to comprise respective connection elements engaging each other, wherein the connection elements are in the form of at least one protruding element projecting from the contact surface of one among the body and the contact tip, and in the form of at least one respective recess made in the other among said body and said contact tip, and wherein a first portion of the end surface of the body extends laterally from a first side of the connection element of the body to a first side surface of the body, a second portion of the end surface of the body extends laterally from a second side of the connection element of the body to a second side surface of the body that is opposite the first side surface, and the contact surface of the contact tip entirely covers the first and second portions of the end surface of the body.

2. The contact probe according to claim 1, wherein a maximum cross-section of the contact tip is equal to a maximum cross-section of the body.

3. The contact probe according to claim 1, wherein the at least one protruding element and the at least one recess have at least one arc-shaped portion.

4. The contact probe according to claim 1, wherein the contact tip comprises at least one blunted portion.

5. The contact probe according to claim 1, wherein at least one cross-sectional dimension of a portion of the contact tip is smaller than a corresponding cross-sectional dimension of the body, said at least one cross-sectional dimension being orthogonal to said longitudinal axis.

6. The contact probe according to claim 5, wherein the contact tip comprises a thinned portion which extends along said longitudinal axis and has a substantially constant cross-section corresponding to the extension of the contact zone.

7. The contact probe according to claim 6, wherein the thinned portion has a length measured along said longitudinal axis comprised between 30 µm and 600 µm.

8. The contact probe according to claim 6, wherein the thinned portion is centered with respect to a symmetry axis of the body.

9. The contact probe according to claim 1, wherein the first conductive material of the body is copper.

10. The contact probe according to claim 1, wherein the second conductive material of the contact tip is selected from rhodium, palladium, iridium, platinum, or alloys thereof.

11. The contact probe according to claim 1, wherein the protruding element has a length, measured along the longitudinal axis, between 10 µm and 100 µm.

12. The contact probe according to claim 1, wherein the contact zone is comprised only in the contact tip.

13. The contact probe according to claim 1, wherein the contact tip is tapered.

14. The contact probe according to claim 1, wherein the transversal dimensions of the body and of the contact tip are coincident.

15. A testing head for testing electronic devices, comprising:
- at least one guide provided with a plurality of guide holes; and
- a plurality of contact probes housed in the guide holes, respectively, at least one of the contact probes comprising:
  - a rod-like body, which is made of a first conductive material and extends along a longitudinal axis, the body having an end portion including an end surface; and
  - a contact tip supported by the body at the end portion thereof, the contact tip being made of a second conductive material that is different from the first conductive material of the body, the contact tip comprising a contact zone configured to perform mechanical and electrical contact with contact pads of a device under test,
- wherein the body and the contact tip comprise respective contact surfaces being in contact with each other, the contact surfaces being complementary to each other and shaped so as to comprise respective connection elements engaging each other,
- wherein the connection elements are in the form of at least one protruding element projecting from the contact surface of one among the body and the contact tip, and in the form of at least one respective recess made in the other among said body and said contact tip, and
- wherein a first portion of the end surface of the body extends laterally from a first side of the connection element of the body to a first side surface of the body, a second portion of the end surface of the body extends laterally from a second side of the connection element of the body to a second side surface of the body that is opposite the first side surface, and the contact surface of the contact tip entirely covers the first and second portions of the end surface of the body.

* * * * *

UNITED STATES PATENT AND TRADEMARK OFFICE
CERTIFICATE OF CORRECTION

PATENT NO. : 11,307,222 B2
APPLICATION NO. : 16/903948
DATED : April 19, 2022
INVENTOR(S) : Fabio Morgana It is certified that error appears in the above-identified patent and that said Letters Patent is hereby corrected as shown below:

On the Title Page

Item (30) add:
--(30) Foreign Application Priority Data
Dec. 18, 2017 (IT) .....................102017000145911--

Signed and Sealed this
Twentieth Day of February, 2024

Katherine Kelly Vidal
*Director of the United States Patent and Trademark Office*